(12) United States Patent
Tao et al.

(10) Patent No.: US 7,291,926 B2
(45) Date of Patent: Nov. 6, 2007

(54) MULTI-CHIP PACKAGE STRUCTURE

(75) Inventors: Su Tao, Kaoshiung (TW); Yu-Fang Tsai, Kaoshiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 11/353,678

(22) Filed: Feb. 14, 2006

(65) Prior Publication Data

US 2006/0131718 A1 Jun. 22, 2006

Related U.S. Application Data

(62) Division of application No. 11/026,763, filed on Dec. 31, 2004, now Pat. No. 7,129,583.

(30) Foreign Application Priority Data

| Dec. 31, 2003 | (TW) | ................ 92137630 A |
| Jun. 30, 2004 | (TW) | ................ 93119671 A |

(51) Int. Cl.
- *H01L 23/02* (2006.01)
- *H01L 25/065* (2006.01)
- *H01L 25/10* (2006.01)
- *H01L 25/03* (2006.01)

(52) U.S. Cl. .............. 257/777; 257/E25.002; 257/E25.013; 257/E25.012; 257/E23.069; 257/E23.177; 257/E23.178; 257/E25.023; 257/686; 257/685; 257/723; 257/724; 257/728; 257/737; 257/738; 257/698; 257/789; 257/780; 257/684; 257/790; 257/787; 257/786; 257/784; 257/778

(58) Field of Classification Search ........ 257/E25.002, 257/E25.013, E25.012, E23.069, E23.177, 257/E23.178, E23.023, 777, 686, 685, 723, 257/724, 728, 737, 738, 698, 789, 780, 684, 257/790, 787

See application file for complete search history.

(56) References Cited

U.S. PATENT DOCUMENTS 6,521,881 B2    2/2003   Tu et al.

(Continued)

OTHER PUBLICATIONS

"Electronic Packaging and Interconnection Handbook," Third Edition, McGraw-Hill, p. 7.80.

(Continued)

*Primary Examiner*—Alexander Oscar Williams
(74) *Attorney, Agent, or Firm*—Seyfarth Shaw LLP

(57) ABSTRACT

The present invention relates to a multi-chip package structure, comprising a first substrate, a first chip, a sub-package and a first molding compound. The first chip is attached to the first substrate. The first molding compound encapsulates the first chip, the sub-package and the top surface of the first substrate. The bottom surface of the sub-package is attached to the first chip. The sub-package comprises a second substrate, a second chip and a second molding compound. The second substrate has a top surface and a bottom surface, and is electrically connected to the first chip. The second chip is attached to the top surface of the second substrate to which the second chip is electrically connected. The second molding compound encapsulates the second chip and part of the top surface of the second substrate. Whereby, the relative large area caused by the parallel arrangement of a plurality of conventional package structures can be reduced, and there is no need to redesign signal-transmitting path.

17 Claims, 17 Drawing Sheets

U.S. PATENT DOCUMENTS

| | | |
|---|---|---|
| 6,583,512 B2 | 6/2003 | Nakaoka et al. |
| 6,607,937 B1 | 8/2003 | Corisis |
| 6,677,672 B2 | 1/2004 | Knapp et al. |
| 6,700,178 B2 | 3/2004 | Chen et al. |
| 6,753,599 B2 | 6/2004 | Kim |
| 6,762,488 B2 | 7/2004 | Maeda et al. |
| 7,064,426 B2 | 6/2006 | Karnezos |
| 7,129,583 B2 | 10/2006 | Tao et al. |
| 2004/0051212 A1 | 3/2004 | Marcos |
| 2004/0051213 A1 | 3/2004 | Marcos |
| 2004/0056277 A1 | 3/2004 | Marcos |
| 2004/0063242 A1 | 4/2004 | Marcos |
| 2004/0063246 A1 | 4/2004 | Marcos |
| 2004/0065963 A1 | 4/2004 | Marcos |
| 2004/0113253 A1 | 6/2004 | Karnezos |
| 2004/0113254 A1 | 6/2004 | Karnezos |
| 2004/0113255 A1 | 6/2004 | Karnezos |
| 2004/0113275 A1 | 6/2004 | Karnezos |
| 2004/0119152 A1 | 6/2004 | Karnezos |
| 2004/0119153 A1 | 6/2004 | Karnezos |
| 2004/0124518 A1 | 7/2004 | Marcos |
| 2005/0133916 A1* | 6/2005 | Karnezos .................... 257/738 |

OTHER PUBLICATIONS

"Microchip Fabrication," Fourth Edition, McGraw-Hill, p. 542.

* cited by examiner

MULTI-CHIP PACKAGE STRUCTURE

Reference to Related Application

This is a division of U.S. patent application Ser. No. 11/026,763, filed Dec. 31, 2004 now U.S. Pat. No. 7,129,583.

BACKGROUND OF THE INVENTION

1. Field of the Invention

The present invention relates to a multi-chip package structure, particularly to a multi-chip package structure having a sub-package.

2. Description of the Related Art

The requirement of high density, high performance and precise cost control of an electronic product speeds up the developments of System On a Chip (SOC) and System In a Package (SIP). The mostly used package technique is Multi-Chip Module (MCM), which integrates the chips having different functions, such as microprocessors, memories, logic elements, optical ICs and capacitors, and replaces the prior art of disposing individual packages on one circuit board.

FIGS. 1 and 2 show the perspective and cross-sectional views of a conventional Multi-Chip Module package structure, respectively. The conventional Multi-Chip Module package structure 10 comprises a first substrate 11, a first package structure 12, a second package structure 13 and a plurality of first solder balls 14.

The first substrate 11 has a top surface 111 and a bottom surface 112. The first solder balls 14 are formed on the bottom surface 112 of the first substrate 11. The first package structure 12 comprises a first chip 121, a plurality of first wires 122 and a first molding compound 123. The first chip 121 is adhered to the top surface 111 of the first substrate 11, and is electrically connected to the first substrate 11 by utilizing the first wires 122. The first molding compound 123 encapsulates the first chip 121, the first wires 122 and part of the top surface 111 of the first substrate 11.

The second package structure 13 comprises a second substrate 131, a second chip 132, a plurality of second wires 133, a second molding compound 134 and a plurality of second solder balls 135. The second substrate 131 has a top surface 1311 and a bottom surface 1312. The second chip 132 is adhered to the top surface 1311 of the second substrate 131, and is electrically connected to the second substrate 131 by utilizing the second wires 133. The second molding compound 134 encapsulates the second chip 132, the second wires 133 and part of the top surface 1311 of the second substrate 131. The second solder balls 135 are formed on the bottom surface 1312 of the second substrate 131. The second package structure 13 is attached to the top surface 111 of the first substrate 11 by surface mounting that utilizes the second solder balls 135 after the second package structure 13 itself has been packaged.

In the conventional Multi-Chip Module package structure 10, the first chip 121 is a microprocessor chip, and the second chip 132 is a memory chip. Because different memory chips have different sizes and different amounts of I/O pins, it is necessary to redesign signal-transmitting path when the microprocessor chip is integrated with different memory chips, which increases the manufacture cost and extends the research time. Additionally, in the conventional Multi-Chip Module package structure 10, the first package structure 12 and the second package structure 13 are disposed in parallel relationship, which occupies a relative large area.

Consequently, there is an existing need for a novel and improved multi-chip package structure to solve the above-mentioned problem.

SUMMARY OF THE INVENTION

One objective of the present invention is to provide a package structure having a sub-package therein. The package structure of the present invention is formed by stacking so as to avoid the shortcoming of large area caused by parallel arrangement of a plurality of conventional package structures.

Another objective of the present invention is to provide a package structure having a sub-package therein. The sub-package is a package that has been tested, and is integrated into the package structure of the present invention as a Known-Good Die (KGD). The manufacture cost of the package structure of the present invention is reduced because package test is cheaper and easier than Known-Good Die test.

Another objective of the present invention is to provide a package structure having a sub-package therein. The package structure of the present invention has at least two chips; therefore, there is no need to redesign the signal-transmitting path between the chips.

Yet another objective of the present invention is to provide a multi-chip package structure comprising a first substrate, a first chip, a sub-package and a first molding compound.

The first substrate has a top surface and a bottom surface. The first chip is attached to the top surface of the first substrate and is electrically connected to the first substrate.

The sub-package has a top surface and a bottom surface, wherein the bottom surface of the sub-package is attached to the first chip. The sub-package includes a second substrate, a second chip and a second molding compound. The second substrate has a top surface and a bottom surface and is electrically connected to the first chip. The second chip is attached to the bottom surface of the second substrate and is electrically connected to the second substrate. The second molding compound is used for encapsulating the second chip and part of the bottom surface of the second substrate.

The first molding compound is used for encapsulating the first chip, the sub-package and the top surface of the first substrate.

DETAILED DESCRIPTION OF THE INVENTION

Figure 1:
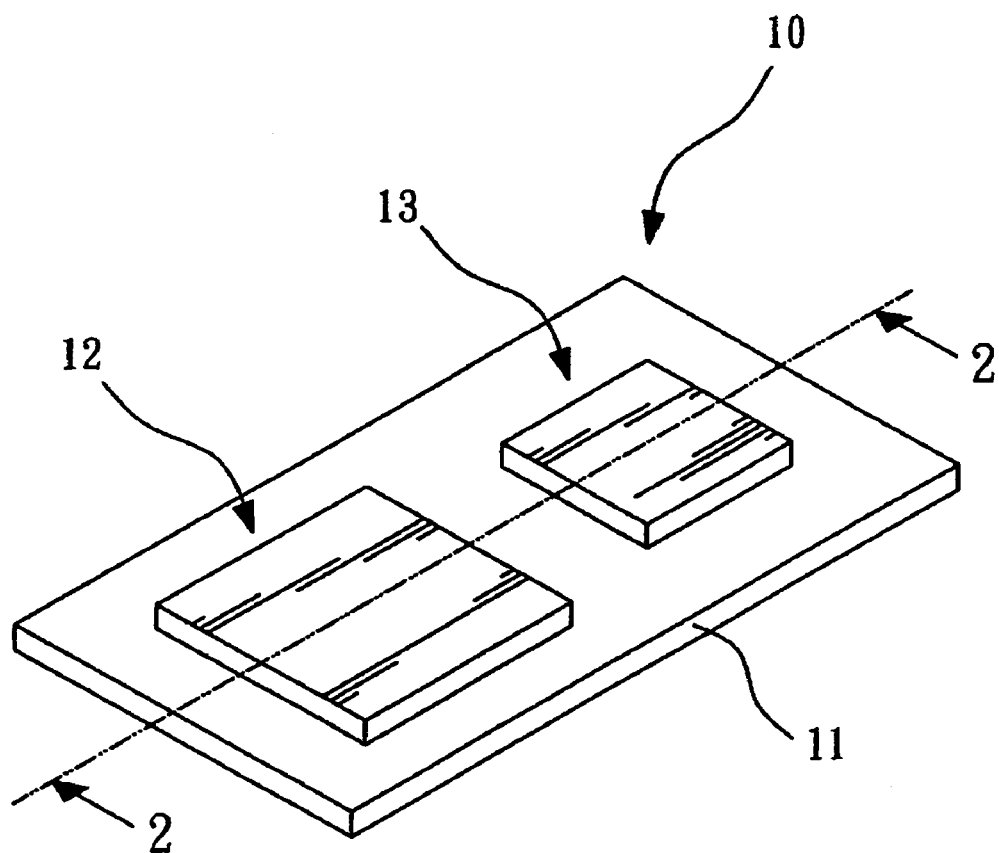
FIG. 1 shows a perspective view of a conventional Multi-Chip Module package structure.
Figure 2:
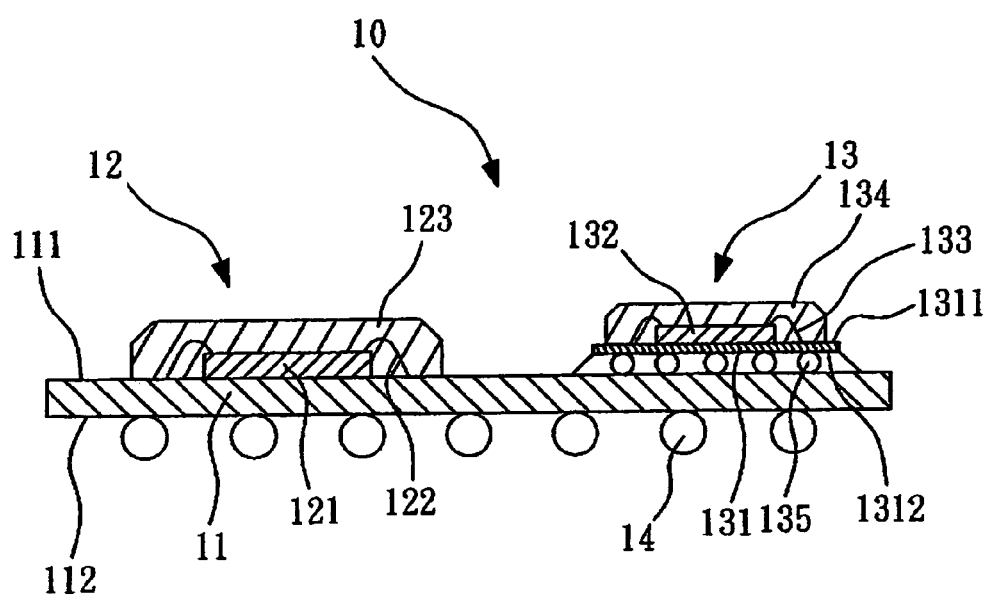
FIG. 2 shows a cross-sectional view of a conventional Multi-Chip Module package structure.
Figure 3:
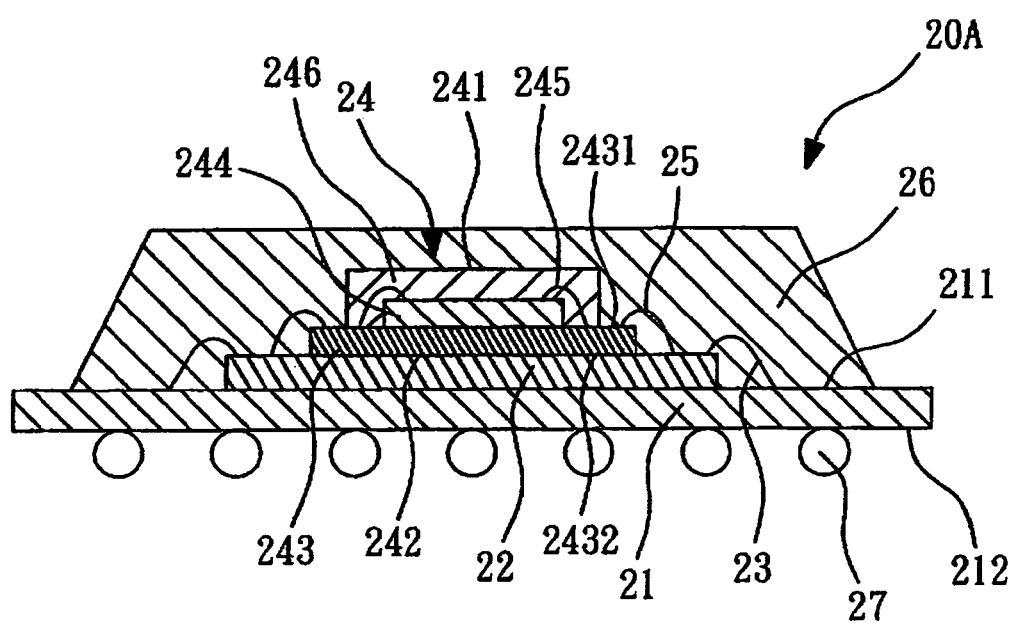
FIG. 3 shows a cross sectional view of a multi-chip package structure according to the first embodiment of the present invention.

FIG. 3 shows a cross sectional view of a multi-chip package structure according to the first embodiment of the present invention. The multi-chip package structure 20A of the embodiment comprises a first substrate 21, a first chip 22, a plurality of first wires 23, a sub-package 24, a plurality of third wires 25, a first molding compound 26 and a plurality of solder balls 27.

The first substrate 21 has a top surface 211 and a bottom surface 212.

The first chip 22 is attached to the top surface 211 of the first substrate 21 and is electrically connected to the first substrate 21 by utilizing the first wires 23. It is to be noted that if the first chip 22 is attached to the first substrate 21 by flip-chip, there is no need to dispose the first wires 23.

The sub-package 24 has a top surface 241 and a bottom surface 242.

The bottom surface 242 of the sub-package 24 is attached to the first chip 22 by utilizing adhesive glue. The sub-package 24 includes a second substrate 243, a second chip 244, a plurality of second wires 245 and a second molding compound 246.

The second substrate 243 has a top surface 2431 and a bottom surface 2432 and is electrically connected to the first chip 22 by utilizing the third wires 25 or electrically connected to the first substrate 21 by utilizing the third wires 25 (not shown). The second chip 244 is attached to the top surface 2431 of the second substrate 243 and is electrically connected to the second substrate 243 by utilizing the second wires 245. The second molding compound 246 is used for encapsulating the second chip 244 and part of the top surface 2431 of the second substrate 243. It is to be noted that the second molding compound 246 does not cover the entire top surface 2431 of the second substrate 243. There are a plurality of pads (not shown) disposed on the portion of the top surface 2431 of the second substrate 243 that is not covered by the second molding compound 246 so as to be electrically connected to the third wires 25.

The sub-package 24 is selected from a group consisting of Land Grid Array (LGA) package, Quad Flat Non-leaded (QFN) package, Small Outline Non-leaded (SON) package and Chip On Film package. In this embodiment, the sub-package 24 is a Land Grid Array package whose bottom surface 2432 has a plurality of landing pads for testing. Therefore, the sub-package 24 is adhered to the first chip 22 after being tested so as to raise the yield rate of the multi-chip package structure 20A.

The first molding compound 26 is used for encapsulating the first chip 22, the sub-package 24, the first wires 23, the third wires 25 and the top surface 211 of the first substrate 21. The solder balls 27 are formed on the bottom surface 212 of the first substrate 21 so as to be electrically connected to an outer circuit.

The first chip 22 and the second chip 244 may be optical chip, logic chip, microprocessor chip or memory chip. In this embodiment, the first chip 22 is a microprocessor chip, and the second chip 244 is a memory chip.

Figure 4:
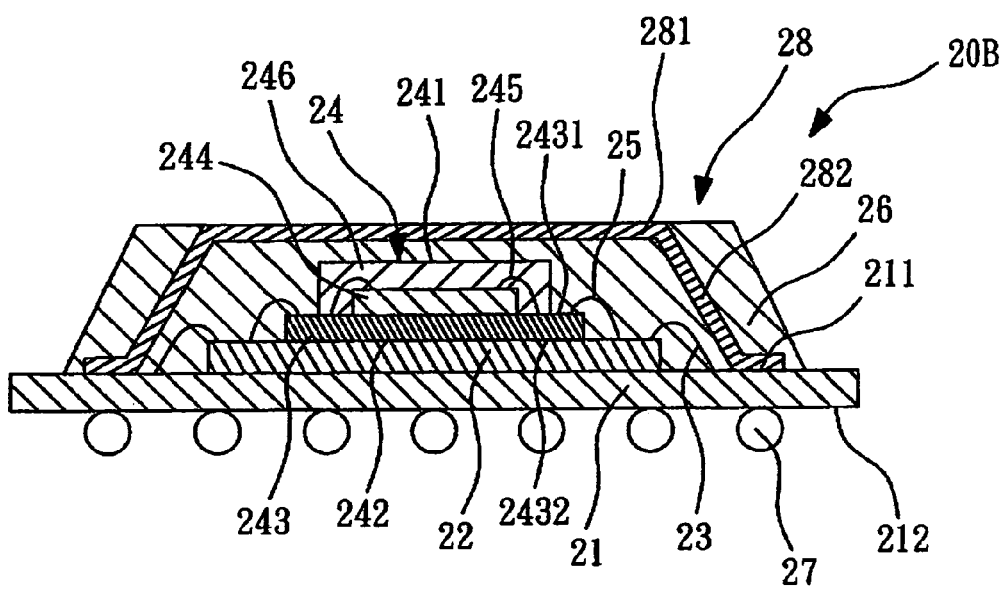
FIG. 4 shows a cross sectional view of a multi-chip package structure according to the second embodiment of the present invention.

FIG. 4 shows a cross sectional view of a multi-chip package structure according to the second embodiment of the present invention.

The multi-chip package structure 20B of the embodiment is substantially equal to that of the first embodiment, except that a heat spreader 28 is added to the embodiment. The heat spreader 28 comprises a heat spreader body 281 and a supporting portion 282, wherein the supporting portion 282 extends outwardly and downwardly from the heat spreader body 281 so as to support the heat spreader body 281. The top surface of the heat spreader body 281 is exposed to the air after being encapsulated so as to increase heat dissipation efficiency.

Figure 5:
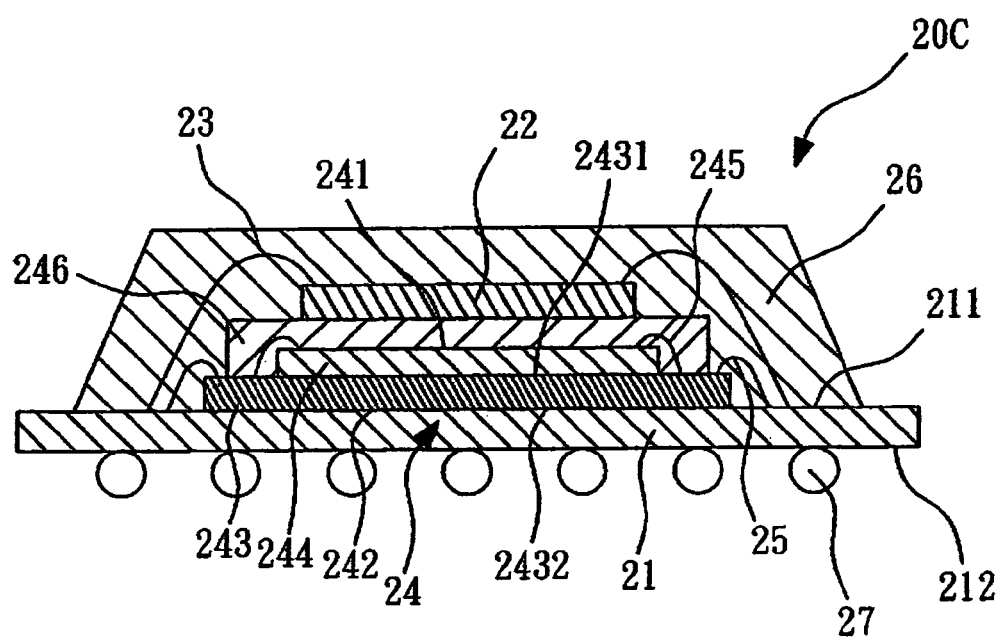
FIG. 5 shows a cross sectional view of a multi-chip package structure according to the third embodiment of the present invention.

FIG. 5 shows a cross sectional view of a multi-chip package structure according to the third embodiment of the present invention. The multi-chip package structure 20C of the embodiment is substantially equal to that of the first embodiment, except that the first chip 22 and the sub-package 24 are transposed. That is, the first chip 22 is disposed on the top surface 241 of the sub-package 24, and the bottom surface 242 of the sub-package 24 is adhered to the top surface 211 of the first substrate 21. Additionally, in this embodiment, the third wires 25 electrically connect the top surface 2431 of the second substrate 243 and the top surface 211 of the first substrate 21. Alternatively, the third wires 25 may electrically connect the first chip 22 and the first substrate 21, or the third wires 25 may electrically connect the first chip 22 and the second substrate 243.

Figure 6:
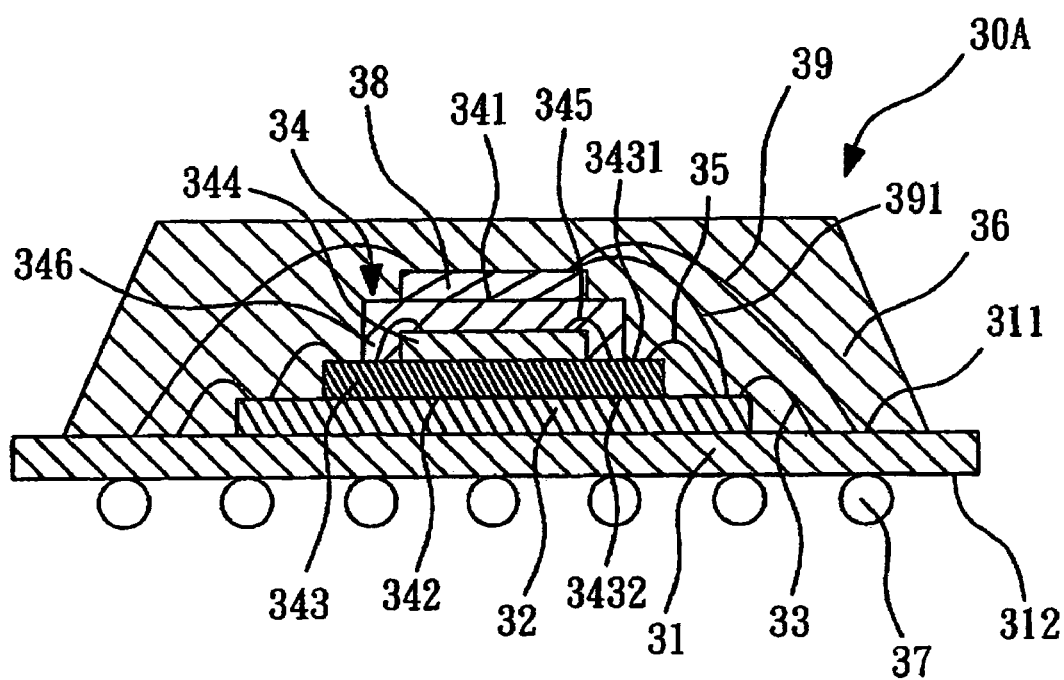
FIG. 6 shows a cross sectional view of a multi-chip package structure according to the fourth embodiment of the present invention.

FIG. 6 shows a cross sectional view of a multi-chip package structure according to the fourth embodiment of the present invention. The multi-chip package structure 30A of the embodiment comprises a first substrate 31, a first chip 32, a plurality of first wires 33, a sub-package 34, a plurality of third wires 35, a first molding compound 36, a plurality of solder balls 37, a third chip 38 and a plurality of fourth wires 39.

The first substrate 31 has a top surface 311 and a bottom surface 312. The first chip 32 is attached to the top surface 311 of the first substrate 31 and is electrically connected to the first substrate 31 by utilizing the first wires 33. It is to be noted that if the first chip 32 is attached to the first substrate 31 by flip-chip, there is no need to dispose the first wires 33.

The sub-package 34 has a top surface 341 and a bottom surface 342. The bottom surface 342 of the sub-package 34 is attached to the first chip 32 by utilizing adhesive glue. The sub-package 34 includes a second substrate 343, a second chip 344, a plurality of second wires 345 and a second molding compound 346.

The second substrate 343 has a top surface 3431 and a bottom surface 3432 and is electrically connected to the first chip 32 by utilizing the third wires 35. The second chip 344 is attached to the top surface 3431 of the second substrate 343 and is electrically connected to the second substrate 343 by utilizing the second wires 345. The second molding compound 346 is used for encapsulating the second chip 344 and part of the top surface 3431, of the second substrate 343. It is to be noted that the second molding compound 346 does not cover the entire top surface 3431 of the second substrate 343. There are a plurality of pads (not shown) disposed on the portion of the top surface 3431 of the second substrate 343 that is not covered by the second molding compound 346 so as to be electrically connected to the third wires 35.

The sub-package 34 is selected from a group consisting of Land Grid Array (LGA) package, Quad Flat Non-leaded (QFN) package, Small Outline Non-leaded (SON) package and Chip On Film package. In this embodiment, the sub-package 34 is a Land Grid Array package whose bottom surface 3432 has a plurality of landing pads for testing. Therefore, the sub-package 34 is adhered to the first chip 32 after being tested so as to raise the yield rate of the multi-chip package structure 30A.

The third chip 38 is attached to the top surface 341 of the sub-package 34 and is electrically connected to the first substrate 31 by utilizing the fourth wires 39 or is electrically connected to the first chip 32 by utilizing the fifth wires 391. The first molding compound 36 is used for encapsulating the first chip 32, the sub-package 34, the first wires 33, the third wires 35, the third chip 38, the fourth wires 39 and the top surface 311 of the first substrate 31. The solder balls 37 are formed on the bottom surface 312 of the first substrate 31 so as to be electrically connected to an outer circuit.

The first chip 32, the second chip 344 and the third chip 38 may be optical chip, logic chip, microprocessor chip or memory chip. In this embodiment, the first chip 32 is a microprocessor chip, the second chip 344 is a memory chip and the third chip 38 is another microprocessor chip.

Figure 7:
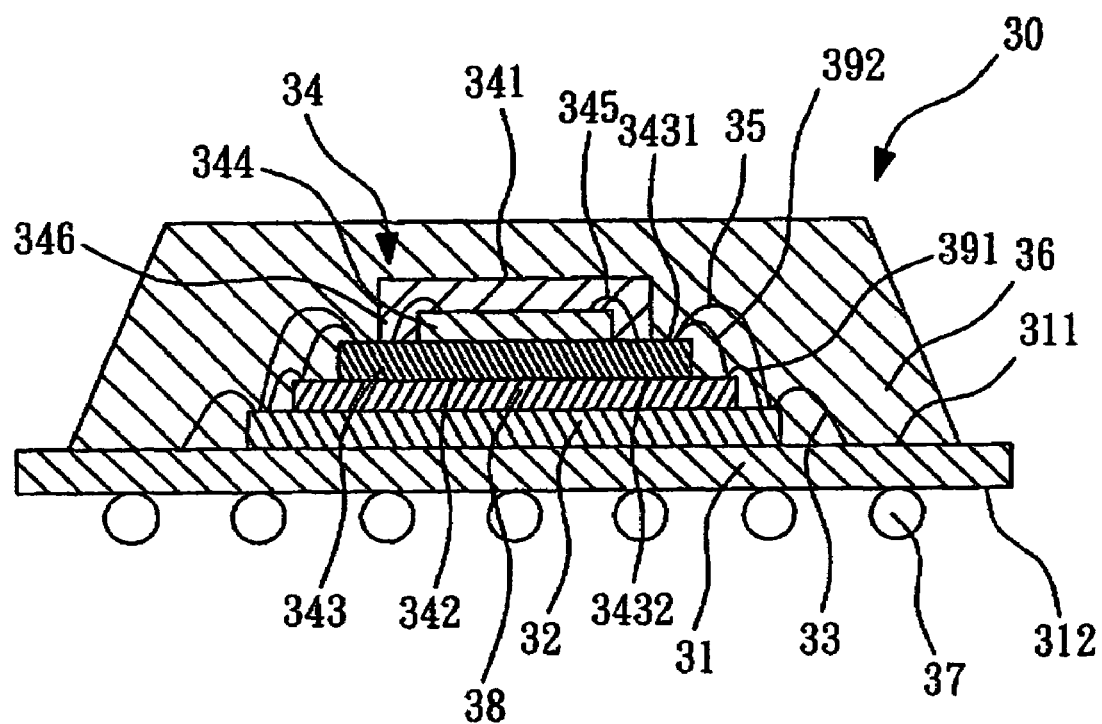
FIG. 7 shows a cross sectional view of a multi-chip package structure according to the fifth embodiment of the present invention.

FIG. 7 shows a cross sectional view of a multi-chip package structure according to the fifth embodiment of the present invention. The multi-chip package structure 30B of the embodiment is substantially equal to that of the fourth embodiment, except that the third chip 38 is disposed between the first chip 32 and the sub-package 34. That is, the first chip 32 is attached to the top surface 311 of the first substrate 31, the third chip 38 is attached to the first chip 32, and the bottom surface 342 of the sub-package 34 is adhered to the third chip 38.

In this embodiment, the first wires 33 electrically connect the first chip 32 and the first substrate 31. The second wires 345 electrically connect the second chip 344 and the second substrate 343. The third wires 35 electrically connect the second substrate 343 and the first chip 32. The fourth wires 392 electrically connect the second substrate 343 and the third chip 38. The fifth wires 391 electrically connect the first chip 32 and the third chip 38.

Figure 8:
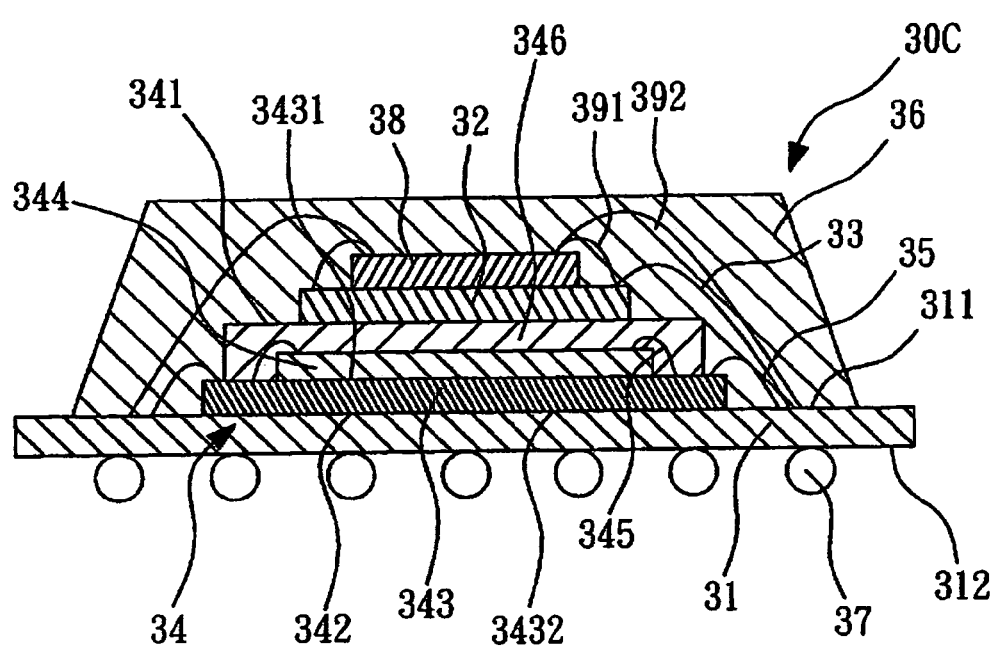
FIG. 8 shows a cross sectional view of a multi-chip package structure according to the sixth embodiment of the present invention.

FIG. 8 shows a cross sectional view of a multi-chip package structure according to the sixth embodiment of the present invention. The multi-chip package structure 30C of the embodiment is substantially equal to that of the fourth embodiment, except that the first chip 32 and the third chip 38 are both disposed above the sub-package 34. That is, the bottom surface 342 of the sub-package 34 is adhered to the top surface 311 of the first substrate 31, the first chip 32 is attached to the top surface 341 of the sub-package 34, and the third chip 38 is attached to the first chip 32.

In this embodiment, the first wires 33 electrically connect the first chip 32 and the first substrate 31. The second wires 345 electrically connect the second chip 344 and the second substrate 343. The third wires 35 electrically connect the first substrate 31 and the second substrate 343. The fourth wires 392 electrically connect the first substrate 31 and the third chip 38. The fifth wires 391 electrically connect the first chip 32 and the third chip 38.

Figure 9:
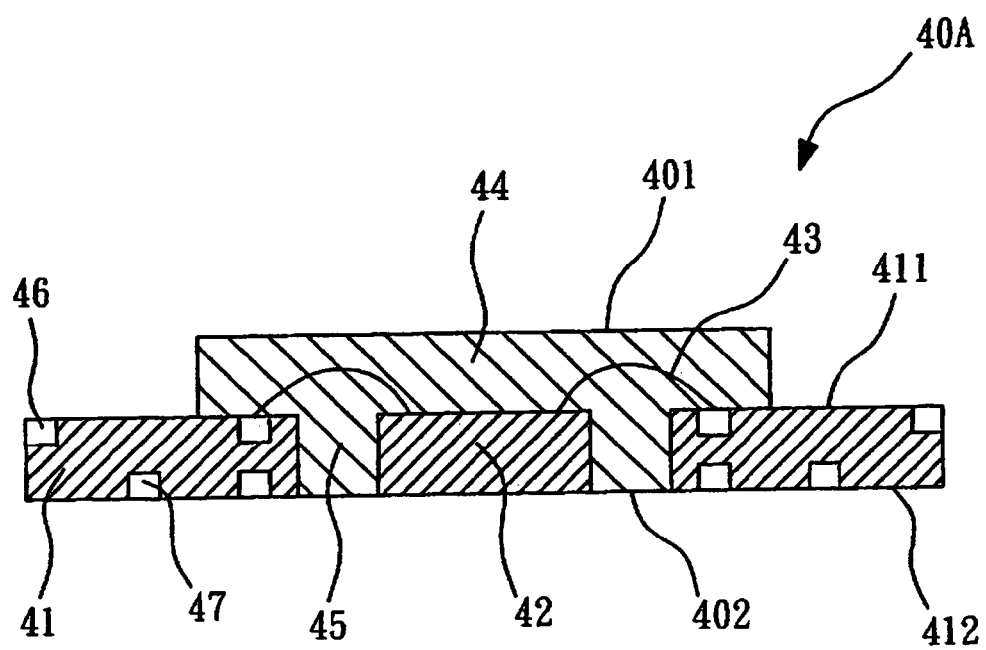
FIG. 9 shows a cross sectional view of a second type of sub-package according to the present invention.

FIG. 9 shows a cross sectional view of a second type of sub-package according to the present invention In abovementioned embodiment, the sub-packages 24 (FIG. 3), 34 (FIG. 6) are first type of sub-package, wherein the second chips 244 (FIG. 3), 344 (FIG. 6) are attached to the top surface of the second substrate 243 (FIG. 3), 343 (FIG. 6). In FIG. 9, the sub-package is a second type of sub-package 40A that has a top surface 401 and a bottom surface 402, and further comprises a second substrate 41, a second chip 42, a plurality of second wires 43 and a second molding compound 44.

The second substrate 41 has a top surface 411, a bottom surface 412 and an opening 45. The second chip 42 is disposed in the opening 45 and is electrically connected to the second substrate 41 by utilizing the second wires 43. The second molding compound 44 is used for encapsulating the second chip 42 and part of the top surface 411 of the second substrate 41. It is to be noted that the second molding compound 44 does not cover the entire top surface 411 of the second substrate 41. There are at least one finger pad 46 and at least one test pad 47 disposed on the portion of the second substrate 41 that is not covered by the second molding compound 44. The finger pad 46 is used for being electrically connected to a wire, and the test pad 47 is used for testing. In this embodiment, the finger pad 46 is disposed on the top surface 411 of the second substrate 41, and the test pad 47 is disposed on the bottom surface 412 of the second substrate 41.

Figure 10:
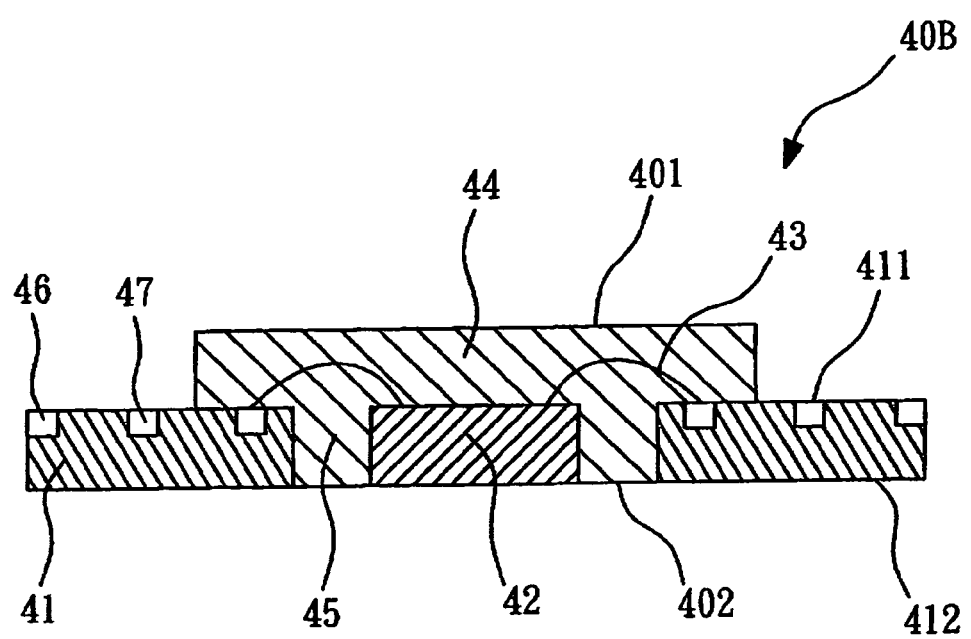
FIG. 10 shows a cross sectional view of a third type of sub-package according to the present invention.

FIG. 10 shows a cross sectional view of a third type of sub-package according to the present invention. The sub-package 40B of the embodiment is substantially equal to the second type of sub-package 40A of FIG. 9, except that the finger pad 46 and the test pad 47 are both disposed on the top surface 411 of the second substrate 41 in this embodiment.

Figure 11:
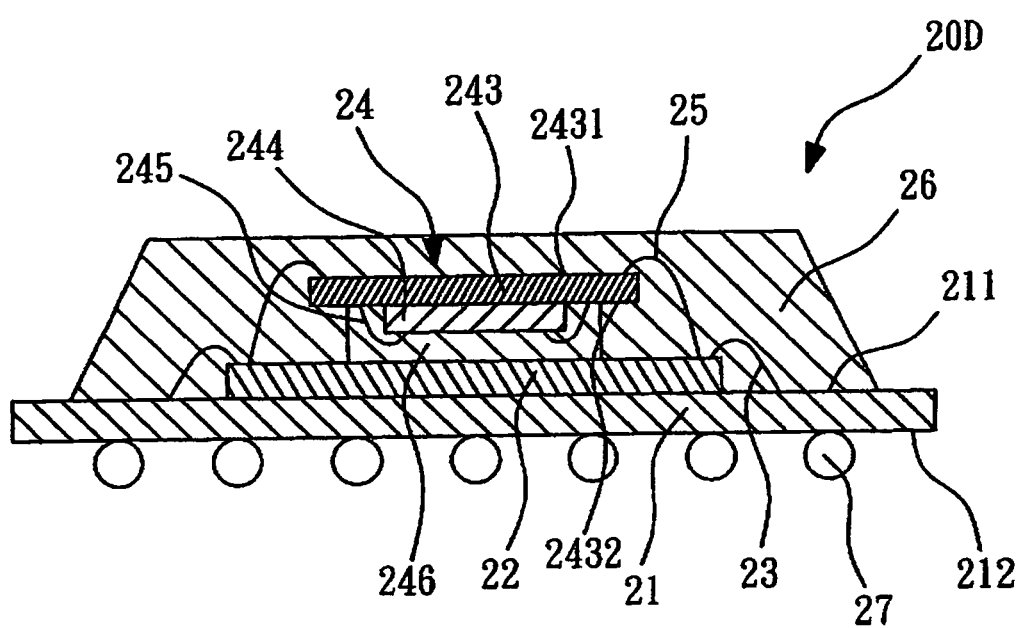
FIG. 11 shows a cross sectional view of a multi-chip package structure according to the seventh embodiment of the present invention.

FIG. 11 shows a cross sectional view of a multi-chip package structure according to the seventh embodiment of the present invention. The multi-chip package structure 20D of the embodiment is substantially equal to that of the first embodiment of FIG. 3, except that the sub-package 24 of the embodiment is inverted. Accordingly, the top surface 2431 of the second substrate 243 is the top surface of the sub-package, the bottom surface of the second molding compound 346 is the bottom surface of the sub-package, and the second chip 244 is attached to the bottom surface 2432 of the second substrate 243. The sub-package 24 of the embodiment is defined as a fourth type of sub-package 24.

Figure 12:
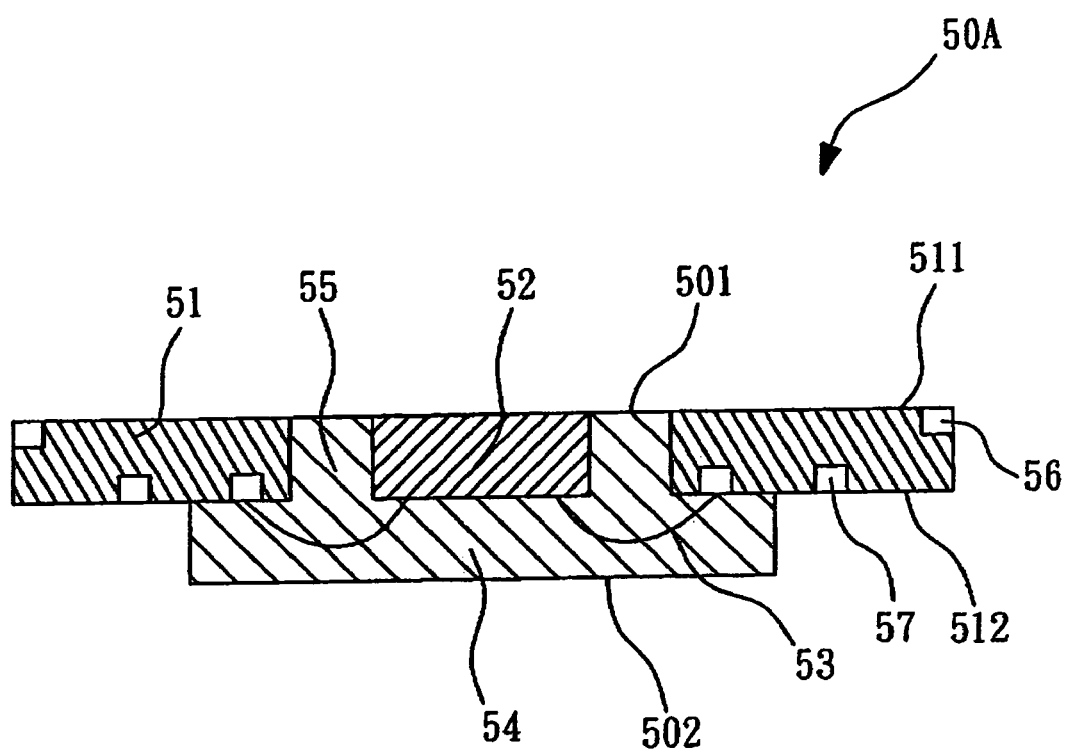
FIG. 12 shows a cross sectional view of a fifth type of sub-package according to the present invention.

FIG. 12 shows a cross sectional view of a fifth type of sub-package according to the present invention. The fifth type of sub-package 50A has a top surface 501 and a bottom surface 502, and further comprises a second substrate 51, a second chip 52, a plurality of second wires 53 and a second molding compound 54.

The second substrate 51 has a top surface 511, a bottom surface 512 and an opening 55. The second chip 52 is disposed in the opening 55 and is electrically connected to the second substrate 51 by utilizing the second wires 53. The second molding compound 54 is used for encapsulating the second chip 52 and part of the bottom surface 512 of the second substrate 51. There are at least one finger pad 56 and at least one test pad 57 disposed on the portion of the second substrate 51 that is not covered by the second molding compound 54. The finger pad 56 is used for being electrically connected to a wire, and the test pad 57 is used for testing. In this embodiment, the finger pad 56 is disposed on the top surface 511 of the second substrate 51, and the test pad 57 is disposed on the bottom surface 512 of the second substrate 51.

Figure 13:
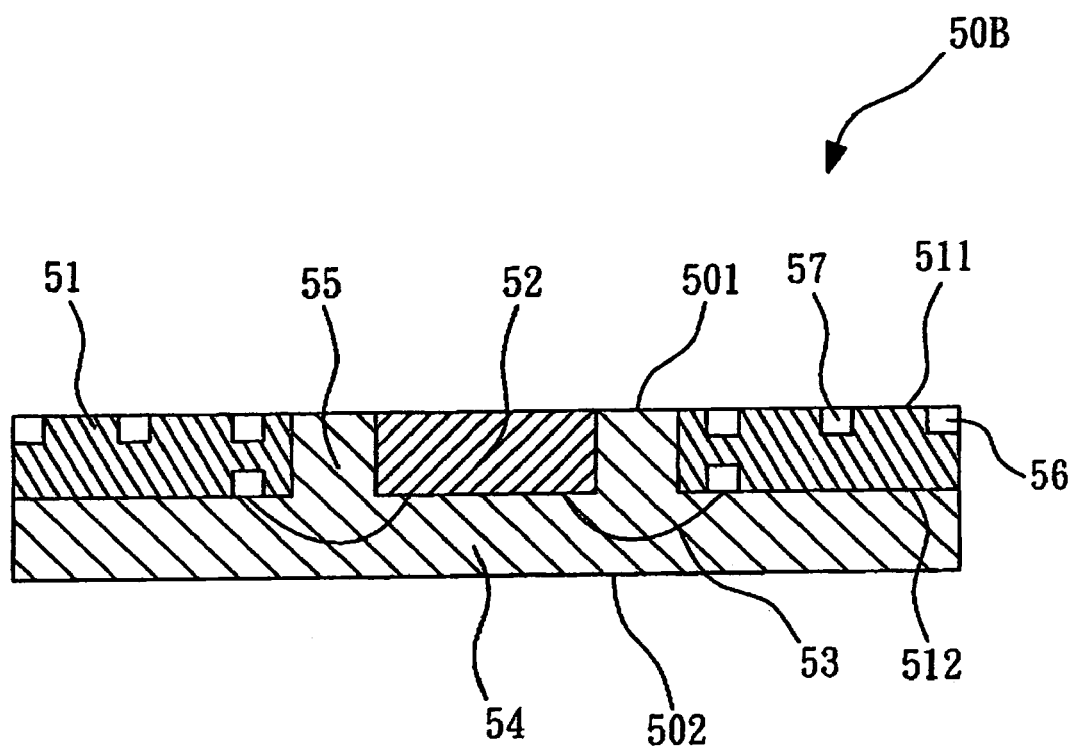
FIG. 13 shows a cross sectional view of a sixth type of sub-package according to the present invention.

FIG. 13 shows a cross sectional view of a sixth type of sub-package according to the present invention. The sub-package 50B of the embodiment is substantially equal to the fifth type of sub-package 50A of to FIG. 12, except that the finger pad 56 and the test pad 57 are both-disposed on the top surface 511 of the second substrate 51 in this embodiment.

Figure 14:
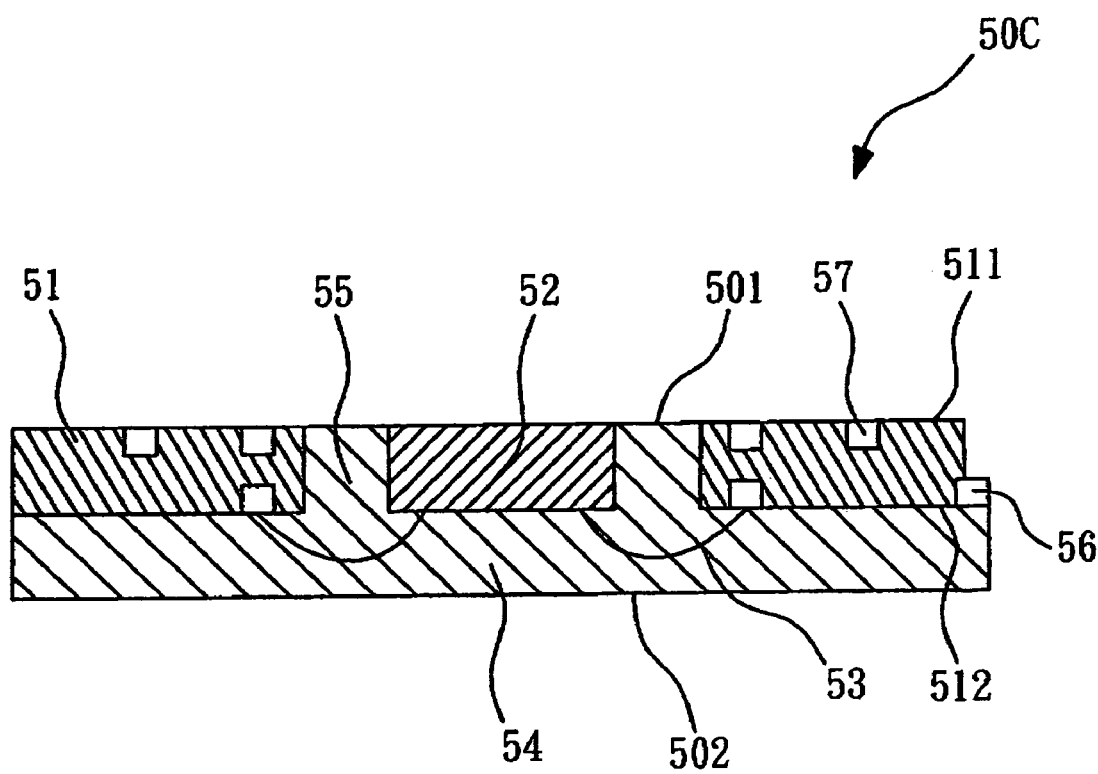
FIG. 14 shows a cross sectional view of a seventh type of sub-package according to the present invention.

FIG. 14 shows a cross sectional view of a seventh type of sub-package according to the present invention. The sub-package 50C of the embodiment is substantially equal to the sixth type of sub-package 50B of FIG. 13, except that the finger pad 56 is disposed on the bottom surface 512 of the second substrate 51, and the test pad 57 is disposed on the top surface 511 of the second substrate 51.

Figure 15:
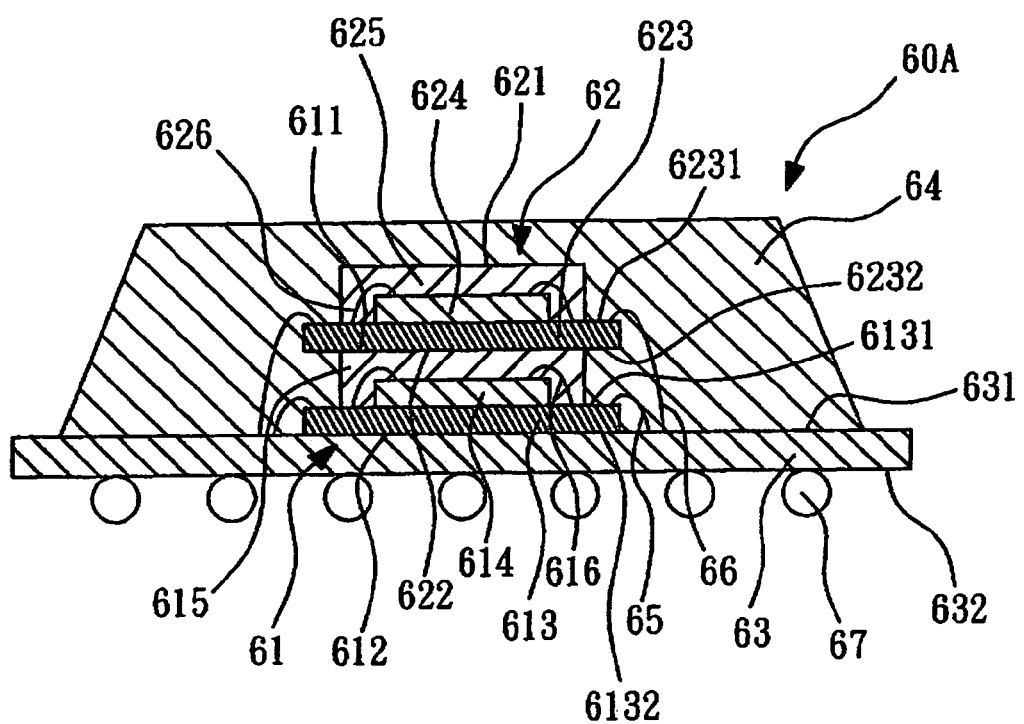
FIG. 15 shows a cross sectional view of a multi-chip package structure according to the eighth embodiment of the present invention.

FIG. 15 shows a cross sectional view of a multi-chip package structure according to the eighth embodiment of the present invention. The multi-chip package structure 60A of the embodiment comprises a first sub-package 61, a second sub-package 62, a third substrate 63, a third molding compound 64, a plurality of third wires 65, a plurality of fourth wires 66 and a plurality of solder bails 67.

The third substrate 63 has a top surface 631 and a bottom surface 632. The third molding compound 64 is used for encapsulating the first sub-package 61, the second sub-package 62 and the top surface 631 of the third substrate 63. The third wires 65 electrically connect the third substrate 63 and the first sub-package 61. The fourth wires 66 electrically connect the third substrate 63 and the second sub-package 62. The solder balls 67 are formed on the bottom surface 632 of the third substrate 63.

The first sub-package 61 has a top surface 611 and a bottom surface 612, and further comprises a first substrate 613, a first chip 614, a first molding compound 615 and a plurality of first wires 616. The first substrate 613 has a top surface 6131 and a bottom surface 6132. The first chip 614 is electrically connected to the first substrate 613 by utilizing the first wires 616. The first molding compound 615 has a top surface and a second surface, and is used for encapsulating the first chip 614 and the first substrate 613.

The second sub-package 62 has a top surface 621 and a bottom surface 622, and further comprises a second substrate 623, a second chip 624, a second molding compound 625 and a plurality of second wires 626. The second substrate 623 has a top surface 6231 and a bottom surface 6232. The second chip 624 is electrically connected to the second substrate 623 by utilizing the second wires 626. The second molding compound 625 has a top surface and a second surface, and is used for encapsulating the second chip 624 and the second substrate 623.

In the first sub-package 61 of this embodiment, the first chip 614 is attached to the top surface 6131 of the first substrate 613 directly, and in the second sub-package 62, the second chip 624 is attached to the top surface 6231 of the second substrate 623 directly. However, it is understood that the first sub-package 61 or the second sub-package 62 can be replaced by the second type of sub-package 40A shown in FIG. 9 or the third type of sub-package 40B shown in FIG. 10.

In this embodiment, the first sub-package 61 and the second sub-package 62 are stacked. However, it is understood that the multi-chip package structure 60 can further comprise a third chip that may be disposed above the second sub-package 62, between the first sub-package 61 and the second sub-package 62, or between the first sub-package 61 and the third substrate 63.

Figure 16:
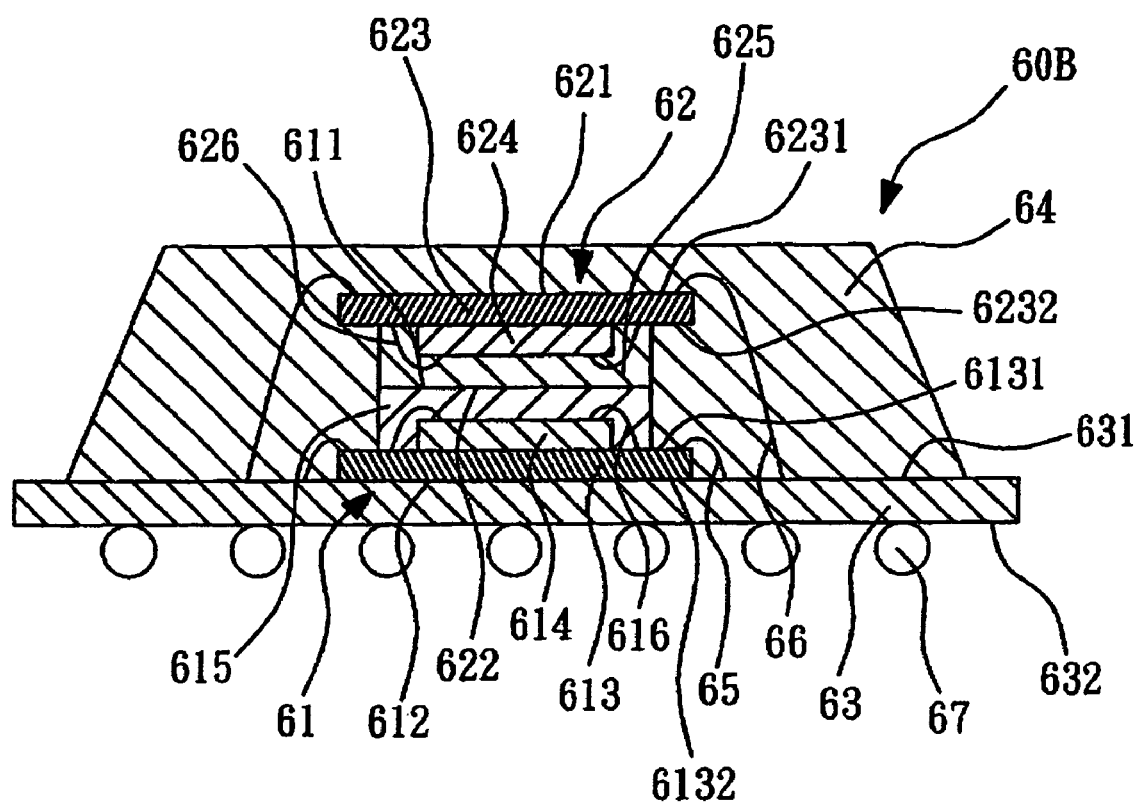
FIG. 16 shows a cross sectional view of a multi-chip package structure according to the ninth embodiment of the present invention.

FIG. 16 shows a cross sectional view of a multi-chip package structure according to the ninth embodiment of the present invention. The multi-chip package structure 60B of the embodiment is substantially equal to that of the eighth embodiment of FIG. 15, except that the sub-package 62 of this embodiment is inverted. It is understood that the first sub-package 61 may also be inverted.

In the second sub-package 62 of this embodiment, the second chip 624 is attached to the bottom surface 6232 of the second substrate 623 directly. However, it is understood that the inverse second sub-package 62 can be replaced by the fifth type of sub-package 50A shown in FIG. 12, the sixth type of sub-package 50B shown in FIG. 13, or the seventh type of sub-package 50C shown in FIG. 14.

In this embodiment, the first sub-package 61 and the second sub-package 62 are stacked. However, it is understood that the multi-chip package structure 60 can further comprise a third chip that may be disposed above the second sub-package 62, between the first sub-package 61 and the second sub-package 62, or between the first sub-package 61 and the third substrate 63.

Figure 17:
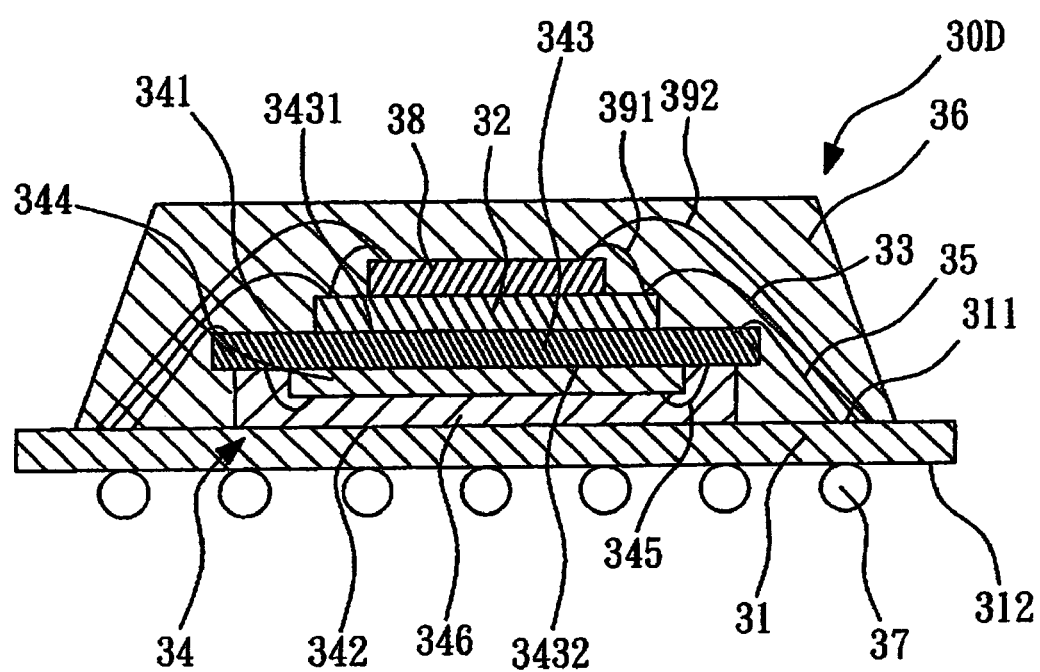
FIG. 17 shows a cross sectional view of a multi-chip package structure according to the tenth embodiment of the present invention.

FIG. 17 shows a cross sectional view of a multi-chip package structure according to the tenth embodiment of the present invention. The multi-chip package structure 30D of the embodiment is substantially the same as that of the sixth embodiment of FIG. 8, except that the sub-package 34 of this embodiment is inverted.

The multi-chip package structure 30D of the embodiment comprises a first substrate 31, a first chip 32, a plurality of first wires 33, a sub-package 34, a plurality of third wires 35, a first molding compound 36, a plurality of solder balls 37, a third chip 38, a plurality of fourth wires 392 and a plurality of fifth wires 391.

The first substrate 31 has a top surface 311 and a bottom surface 312. The bottom surface 342 of the sub-package 34 is attached to the top surface 311 of the first substrate 31 by utilizing adhesive glue. The sub-package 34 includes a second substrate 343, a second chip 344, a plurality of second wires 345 and a second molding compound 346.

The second substrate 343 has a top surface 3431 and a bottom surface 3432 and is electrically connected to the first substrate 31 by utilizing the third wires 35. The second chip 344 is attached to the bottom surface 3433 of the second substrate 343 and is electrically connected to the second substrate 343 by utilizing the second wires 345. The second molding compound 346 is used for encapsulating the second chip 344 and part of the bottom surface 3432 of the second substrate 343.

The first chip 32 is attached to the top surface 341 of the sub-package 34 and is electrically connected to the first substrate 31 by utilizing the first wires 33. The third chip 38 is attached to the first chip 32 and is electrically connected to the first substrate 31 by utilizing the fourth wires 392 or is electrically connected to the first chip 32 by utilizing the fifth wires 391.

The first molding compound 36 is used for encapsulating the first chip 32, the sub-package 34, the first wires 33, the third wires 35, the third chip 38, the fourth wires 392, the fifth wires 391 and the top surface 311 of the first substrate 31. The solder balls 37 are formed on the bottom surface 312 of the first substrate 31 so as to be electrically connected to an outer circuit.

While several embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications which maintain the spirit and scope of the present invention are within the scope as defined in the appended claims.

What is claimed is:

1. A multi-chip package structure comprising:
   a third substrate having a top surface and a bottom surface;
   a first sub-package having a top surface and a bottom surface, wherein the bottom surface of the first sub-package is attached to the top surface of the third substrate directly, the first sub-package includes:
      a first substrate having a top surface and a bottom surface, the first substrate being electrically connected to the third substrate;
      a first chip attached to the top surface of the first substrate and electrically connected to the first substrate; and
      a first molding compound used for encapsulating the first chip and part of the top surface of the first substrate;
   a second sub-package having a top surface and a bottom surface, wherein the bottom surface of the second sub-package is attached to the top surface of the first sub-package, the second sub-package including:
      a second substrate having a top surface and a bottom surface, the second substrate being electrically connected to the third substrate;
      a second chip attached to the top surface of the second substrate and electrically connected to the second substrate; and
      a second molding compound used for encapsulating the second chip and part of the top surface of the second substrate; and
   a third molding compound used for encapsulating the first sub-package, the second sub-package and the top surface of the third substrate.

2. The package structure according to claim 1, wherein the third substrate is electrically connected to the first sub-package.

3. The package structure according to claim 1, further comprising a plurality of third wires that electrically connect the third substrate and the first sub-package.

4. The package structure according to claim 3, wherein the third wires connect the top surface of the first substrate and the top surface of the third substrate.

5. The package structure according to claim 1, wherein the third substrate is electrically connected to the second sub-package.

6. The package structure according to claim 1, further comprising a plurality of fourth wires that electrically connect the third substrate and the second sub-package.

7. The package structure according to claim 6, wherein the fourth wires connect the top surface of the second substrate and the top surface of the third substrate.

8. The package structure according to claim 1, wherein the first chip is electrically connected to the first substrate.

9. The package structure according to claim 1, wherein the first sub-package flitter includes a plurality of first wires that electrically connect the first chip and the fast substrate.

10. The package structure according to claim 1, wherein the second chip is electrically connected to the second substrate.

11. The package structure according to claim 1, wherein the second sub-package further includes a plurality of second wires that electrically connect the second chip and the second substrate.

12. The package structure according to claim 1, wherein the second substrate further has an opening in which the second chip is disposed, the second substrate further has at least one finger pad and at least one test pad, the finger pad is used for being electrically connected to a wire, and the test pad is used for testing.

13. The package structure according to claim 12, wherein the finger pad and the test pad are all disposed on the top surface of the second substrate.

14. The package structure according to claim 12, wherein the finger pad is disposed on the top surface of the second substrate, and the test pad is disposed on the bottom surface of the second substrate.

15. The package structure according to claim 1, wherein the first substrate further has an opening in which the first chip is disposed, the first substrate further has at least one finger pad and at least one test pad, the finger pad is used for being electrically connected to a wire, and the test pad is used for testing.

16. The package structure according to claim 15, wherein the finger pad and the test pad are all disposed on the top surface of the first substrate.

17. The package structure according to claim 15, wherein the finger pad is disposed on the top surface of the first substrate, and the test pad is disposed on the bottom surface of the first substrate.

* * * * *

UNITED STATES PATENT AND TRADEMARK OFFICE
CERTIFICATE OF CORRECTION

| | | |
|---|---|---|
| PATENT NO. | : 7,291,926 B2 | Page 1 of 1 |
| APPLICATION NO. | : 11/353678 | |
| DATED | : November 6, 2007 | |
| INVENTOR(S) | : Su Tao and Yu-Fang Tsai | |

It is certified that error appears in the above-identified patent and that said Letters Patent is hereby corrected as shown below:

Column 10

Claim 9; line 15 "flitter" should be --further--.

Claim 9; line 16 "fast" should be --first--.

Signed and Sealed this

Twenty Second Day of April, 2008

JON W. DUDAS
*Director of the United States Patent and Trademark Office*